United States Patent
Zhang et al.

(10) Patent No.: US 10,455,724 B1
(45) Date of Patent: Oct. 22, 2019

(54) HARD DISK FIXING MECHANISM

(71) Applicant: HONGFUJIN PRECISION ELECTRONICS (TIANJIN) CO., LTD., Tianjin (CN)

(72) Inventors: Ya-Ni Zhang, Tianjin (CN); Zhao-Hui Zhen, Tianjin (CN); Han-Yu Li, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/253,523

(22) Filed: Jan. 22, 2019

(30) Foreign Application Priority Data

Jan. 9, 2019 (CN) .......................... 2019 1 0018333

(51) Int. Cl.
*H05K 7/18* (2006.01)
(52) U.S. Cl.
CPC ..................................... *H05K 7/18* (2013.01)
(58) Field of Classification Search
CPC ........................................................ H05K 7/18
See application file for complete search history.

(56) References Cited

U.S. PATENT DOCUMENTS

| | | | |
|---|---|---|---|
| 10,088,876 B1* | 10/2018 | Li | G06F 1/187 |
| 10,111,354 B2* | 10/2018 | Hu | H05K 7/1487 |
| 10,257,956 B2* | 4/2019 | Van Pelt | H05K 7/1489 |
| 2009/0316342 A1* | 12/2009 | Li | H04M 1/0254 |
| | | | 361/679.01 |
| 2012/0176743 A1* | 7/2012 | Gong | G11B 33/124 |
| | | | 361/679.33 |
| 2014/0022723 A1* | 1/2014 | Yang | G06F 1/187 |
| | | | 361/679.37 |
| 2015/0002004 A1* | 1/2015 | Wang | G06F 1/183 |
| | | | 312/223.2 |
| 2016/0132080 A1* | 5/2016 | Shen | G06F 1/187 |
| | | | 361/679.33 |

* cited by examiner

*Primary Examiner* — Lisa Lea-Edmonds
(74) *Attorney, Agent, or Firm* — ScienBiziP, P.C.

(57) ABSTRACT

A hard disk fixing mechanism implemented in a chasses includes a fixing frame, at least one mounting frame, and at least one fixing mechanism. The fixing frame includes a base plate and a first fixing plate arranged on the base plate. The first fixing plate defines at least one through slot. The base plate bears the mounting frame. The mounting frame mounts a hard disk. The mounting frame includes a projecting portion. The projecting portion defines a through hole. The projecting portion extends from the through slot to an opposite side of the first fixing plate. The fixing mechanism includes a sliding block. The sliding block is movably arranged on the first fixing plate and extends into the through hole to lock the mounting frame.

16 Claims, 3 Drawing Sheets

HARD DISK FIXING MECHANISM

FIELD

The subject matter herein generally relates to a hard disk fixing mechanism for mounting a hard disk in a chassis.

BACKGROUND

Generally, a hard disk is locked to a fixing frame in a computer chassis by a fixing member, such as a screw. Hard disk fixing mechanisms which are easy to assemble and disassemble the hard disks are usually large in size and complicated in structure, such hard disk fixing mechanisms take up internal space of the chassis and affects heat dissipation of the computer. In addition, complex structures may increase a cost of the computer.

BRIEF DESCRIPTION OF THE DRAWINGS

Implementations of the present disclosure will now be described, by way of embodiments, with reference to the attached figures.

DETAILED DESCRIPTION

Figure 1:
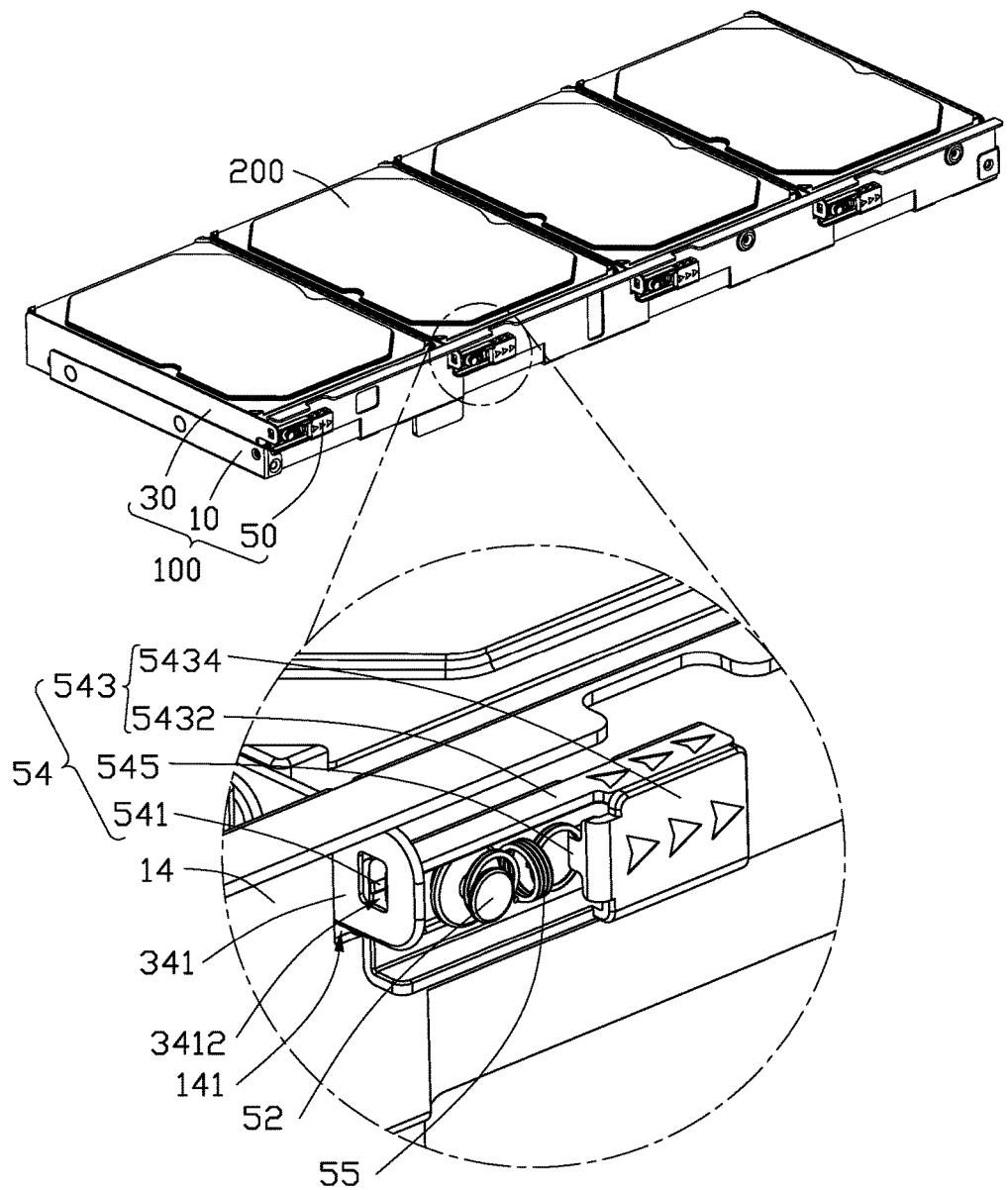
FIG. 1 is an isometric view of an embodiment of a hard disk fixing mechanism.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows an embodiment of a hard disk fixing mechanism 100 applicable in a chassis (not shown). The hard disk fixing mechanism 100 mounts a plurality of hard disks 200. The hard disk fixing mechanism 100 includes a fixing frame 10, at least one mounting frame 30, and at least one fixing mechanism 50. The fixing frame 10 mounts the hard disk fixing mechanism 100 within the chassis. The mounting frame 30 mounts the hard disks 200 within the fixing frame 10. At least one of the mounting frames 30 is movably received in the fixing frame 10. At least one of the fixing mechanisms 50 fixes at least one of the mounting frames 30 within the fixing frame 10.

Figure 2:
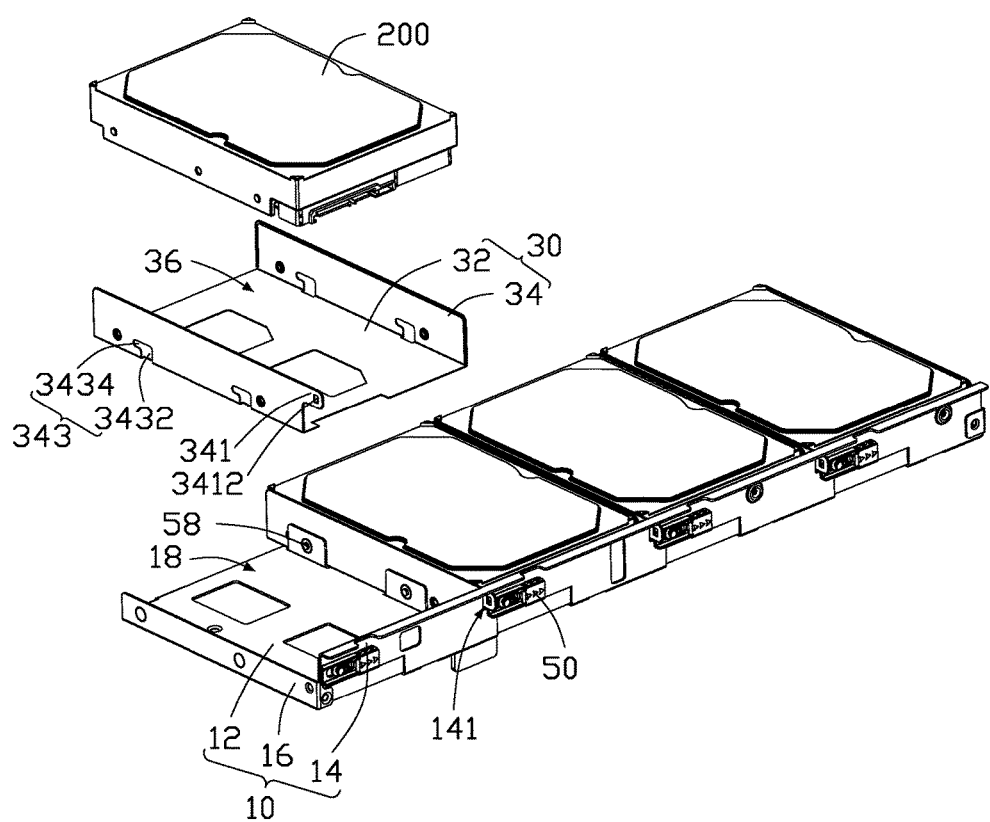
FIG. 2 is a partial exploded view of the hard disk fixing mechanism of FIG. 1.

Referring to FIG. 2, the fixing frame 10 includes a bottom plate 12, a first fixing plate 14 and at least two second fixing plates 16. The first fixing plate 14 and the at least two second fixing plates 16 are arranged on the bottom plate 12. The at least two second fixing plates 16 are oppositely arranged and substantially perpendicular to the first fixing plate 14.

Each two adjacent second fixing plates 16, the first fixing plate 14, and the bottom plate 12 cooperatively define an accommodating chamber 18. The accommodating chamber 18 receives the mounting frame 30. In one embodiment, a quantity of the second fixing plates 16 is five, and the five second fixing plates 16, the first fixing plate 14, and the bottom plate 12 define four receiving cavities 18. In other embodiments, the quantity of the receiving chambers 18 is at least one. In other embodiments, the second fixing plates 16 may be omitted.

The first fixing plate 14 defines at least one through groove 141. Each through slot 141 communicates with a corresponding accommodating chamber 18.

The mounting frame 30 includes a connecting plate 32 and two mounting plates 34. The two mounting plates 34 are coupled substantially perpendicularly to the connecting plate 32 and are oppositely arranged. The connecting plate 32 and the two mounting plates 34 cooperatively define a receiving cavity 36 to receive the corresponding hard disk 200. The hard disk 200 is mounted to the mounting plate 34 by screws. One of the mounting plates 34 includes a projecting portion 341. A through hole 3412 is defined in the projecting portion 341. After the mounting frame 30 is received in the accommodating chamber 18, the projecting portion 341 extends through the through slot 141 to a side of the first fixing plate 14 facing away from the accommodating chamber 18. In other embodiments, the mounting frame 30 can be other structures as long as it includes the projecting portion 341 and can fix the hard disk 200.

Figure 3:
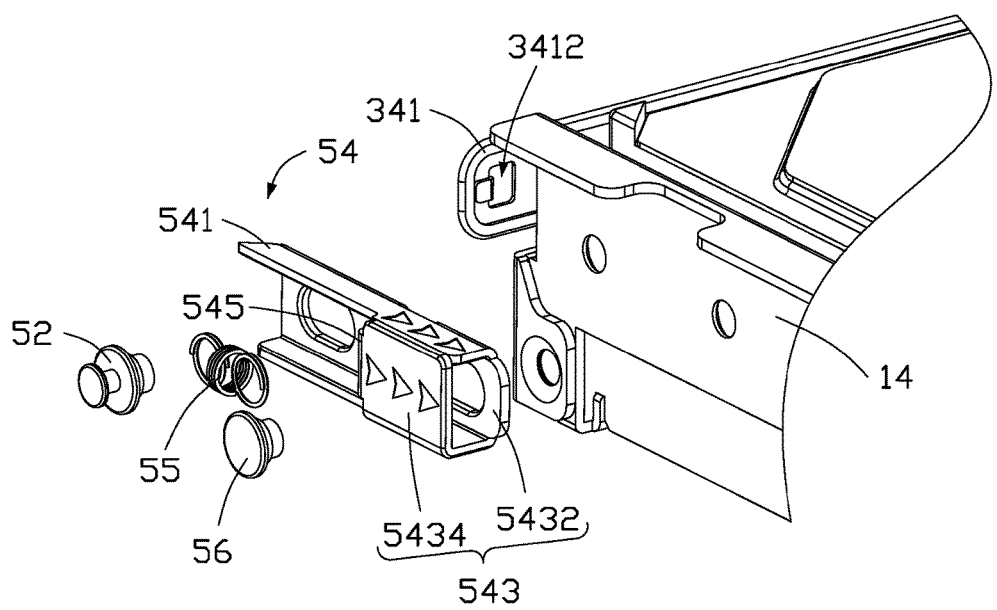
FIG. 3 is a partial close-up view of the hard disk fixing mechanism of FIG. 1.

Referring to FIG. 3, at least one of the fixing mechanisms 50 is arranged on a side of the first fixing plate 14 facing away from the accommodating chamber 18 and adjacent to a corresponding one of the through grooves 141. The fixing mechanism 50 includes a sliding block 54. The sliding block 54 is slidably mounted on the first fixing plate 14 and can partially extend into the through hole 3412 to lock the mounting frame 30.

In one embodiment, the fixing mechanism 50 further includes a first fixing rod 52 and an elastic member 55. The first fixing rod 52 is arranged on a side of the first fixing plate 14 facing away from the accommodating chamber 18. The first fixing rod 52 and the sliding block 54 are elastically coupled to respective two ends of the elastic member 55 to drive the sliding block 54 to move toward the projecting portion 341 to pass the locking portion 541 through the through hole 3412. In other embodiments, the first fixing rod 52 and the elastic member 55 may be omitted as long as the sliding block 54 can lock the mounting frame 30.

In one embodiment, the sliding block 54 includes a locking portion 541 and a main portion 543. The main portion 543 includes a first plate 5432 and a second plate 5434. The first plate 5432 and the second plate 5434 are oppositely arranged. The first plate 5432 is arranged adjacent to the first fixing plate 14. The first plate 5432 is slidably sleeved over the first fixing rod 52. The second plate 5434 is arranged away from the first fixing rod 52. The locking portion 541 is located on a side of the first plate 5432 facing the projecting portion 341.

In one embodiment, the sliding block 54 further includes a connecting portion 545. One end of the connecting portion 545 is coupled to a side of the second plate 5434 facing the first fixing rod 52. A distal end of the connecting portion 545 is curved away from the first fixing rod 52. One end of the elastic member 55 is coupled to the connecting portion 545.

In other embodiments, the sliding block 54 can be other structures as long as it can partially extend through the through hole 3412.

In one embodiment, the fixing mechanism 50 further includes a second fixing rod 56. The second fixing rod 56 is arranged on the first fixing plate 14 and spaced from the first fixing rod 52. The first plate 5432 is slidably sleeved over the first fixing rod 52 and the second fixing rod 56. The first fixing rod 52 and the second fixing rod 56 prevent the sliding block 54 from rotating. In other embodiments, the second fixing rod 56 may be omitted.

Referring to FIG. 2, in one embodiment, the fixing mechanism 50 further includes at least two positioning rods 58. At least one of the positioning rods 58 is arranged on each of the second fixing plates 16. The mounting plate 34 defines a latching slot 343. The latching slot 343 includes a sliding portion 3432 and a latching portion 3434. One end of the sliding portion 3432 extends to the connecting plate 32. The latching portion 3434 is connected to an end of the sliding portion 3432 away from the connecting plate 32. The latching portion 3434 extends in a direction parallel to a plane of the connecting plate 32. The positioning rod 58 slides along the sliding portion 3432 to the latching portion 3434 to latch the mounting frame 30. In other embodiments, the positioning rod 58 and the latching slot 343 may be omitted.

In assembly, the hard disk 200 is received in the receiving cavity 36 and mounted to the mounting plate 34 by screws. Next, the mounting frame 30 is received in the accommodating chamber 18, and the positioning rod 58 is slid from the sliding portion 3432 to the latching portion 3434. An elastic force of the elastic member 55 drives the locking portion 541 to extend through the through hole 3412 to mount the mounting frame 30.

To remove the hard disk 200, the sliding block 54 is pulled to release the locking portion 541 from the through hole 3412. After the positioning rod 58 is slid from the latching portion 3434 to the sliding portion 3432, the mounting frame 30 can be taken out. Thus, assembly and disassembly of the hard disk fixing mechanism 100 is simple.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A hard disk fixing mechanism implemented in a chassis, the hard disk fixing mechanism comprising:
    a fixing frame;
    at least one mounting frame; and
    at least one fixing mechanism; wherein:
    the fixing frame comprises a base plate and a first fixing plate arranged on the base plate;
    the first fixing plate defines at least one through slot;
    the base plate supports the mounting frame;
    the mounting frame mounts a hard disk;
    the mounting frame comprises a projecting portion;
    the projecting portion defines a through hole;
    the projecting portion extends from the through slot to an opposite side of the first fixing plate;
    the fixing mechanism comprises a sliding block;
    the sliding block is movably arranged on the first fixing plate and locks the mounting frame when the sliding block extends into the through hole.

2. The hard disk fixing mechanism of claim 1, wherein:
    the fixing frame further comprises at least two second fixing plates;
    each two adjacent second fixing plates, the first fixing plate, and the base plate cooperatively define an accommodating chamber to receive one mounting frame.

3. The hard disk fixing mechanism of claim 2, wherein:
    the mounting bracket comprises a connecting plate and two mounting plates respectively oppositely arranged on the connecting plate;
    the connecting plate and the two mounting plates cooperatively define a receiving cavity to receive the hard disk;
    the projecting portion is arranged on one of the mounting plates.

4. The hard disk fixing mechanism of claim 3 further comprising at least two positioning rods, wherein:
    each of the second fixing plates is arranged with at least one positioning rod;
    the mounting plate defines a latching slot;
    the latching slot comprises a sliding portion and a latching portion;
    the sliding portion extends to the first mounting plate;
    the latching portion is coupled to an end of the sliding portion away from the first mounting plate;
    the latching portion extends parallel to the first mounting board;
    the positioning rod slides along the sliding portion to the latching portion to latch the mounting frame.

5. The hard disk fixing mechanism of claim 1 further comprising a first fixing rod and an elastic member, wherein:
    the first fixing rod is arranged on the first fixing plate;
    two ends of the elastic member are respectively coupled to the sliding block and the first fixing rod;
    the elastic member elastically drives the sliding block to extend into the through hole.

6. The hard disk fixing mechanism of claim 5, wherein:
    the sliding block comprises a main portion and a locking portion;
    the main portion comprises a first plate and a second plate;
    the first plate is oppositely arranged from the second plate;
    the first plate is arranged adjacent to the first fixing plate;
    the first plate is slidably sleeved over the first fixing rod;
    the second plate is arranged away from the first fixing rod;
    the locking portion is arranged on a side of the first plate facing the projecting portion;
    the locking portion extends into the through hole.

7. The hard disk fixing mechanism of claim 6, wherein:
    the sliding block comprises a connecting portion;
    one end of the connecting portion is coupled to a side of the second plate facing the first fixing rod;

a distal end of the connecting portion is bent away from the first fixing rod;

one end of the elastic piece is coupled to the connecting portion.

8. The hard disk fixing mechanism of claim 7 further comprising a second fixing rod, wherein:

the second fixing rod is arranged on the first fixing plate and spaced apart from the first fixing rod;

the first plate is slidably sleeved over the first fixing rod and the second fixing rod.

9. A hard disk fixing mechanism implemented in a chassis, the hard disk fixing mechanism comprising:

a fixing frame;

a plurality of mounting frames; and a plurality of fixing mechanisms; wherein:

the fixing frame comprises a base plate and a first fixing plate arranged on the base plate;

the first fixing plate defines at least one through slot;

the base plate supports the plurality of mounting frames;

each of the mounting frames mounts a corresponding hard disk;

each of the fixing mechanisms is located corresponding to one of the mounting frames;

each of the mounting frames comprises a projecting portion;

the projecting portion defines a through hole;

the projecting portion extends from the through slot to an opposite side of the first fixing plate;

each of the fixing mechanisms comprises a sliding block;

the sliding block is movably arranged on the first fixing plate and locks the mounting frame when extending into the through hole.

10. The hard disk fixing mechanism of claim 9, wherein:

Each of the fixing frames further comprises at least two second fixing plates;

each two adjacent second fixing plates, the first fixing plate, and the base plate cooperatively define an accommodating chamber to receive one of the plurality of mounting frames.

11. The hard disk fixing mechanism of claim 10, wherein:

the mounting bracket comprises a connecting plate and two mounting plates respectively oppositely arranged on the connecting plate;

the connecting plate and the two mounting plates cooperatively define a receiving cavity to receive the hard disk;

the projecting portion is arranged on one of the mounting plates.

12. The hard disk fixing mechanism of claim 11, wherein:

each of the second fixing plates is arranged with at least one positioning rod;

the mounting plate defines a latching slot;

the latching slot comprises a sliding portion and a latching portion;

the sliding portion extends to the first mounting plate;

the latching portion is coupled to an end of the sliding portion away from the first mounting plate;

the latching portion extends parallel to the first mounting board;

the positioning rod slides along the sliding portion to the latching portion to latch the mounting frame.

13. The hard disk fixing mechanism of claim 12 further comprising a first fixing rod and an elastic member, wherein:

the first fixing rod is arranged on the first fixing plate;

two ends of the elastic member are respectively coupled to the sliding block and the first fixing rod;

the elastic member elastically drives the sliding block to extend into the through hole.

14. The hard disk fixing mechanism of claim 13, wherein:

the sliding block comprises a main portion and a locking portion;

the main portion comprises a first plate and a second plate;

the first plate is oppositely arranged from the second plate;

the first plate is arranged adjacent to the first fixing plate;

the first plate is slidably sleeved over the first fixing rod;

the second plate is arranged away from the first fixing rod;

the locking portion is arranged on a side of the first plate facing the projecting portion;

the locking portion extends into the through hole.

15. The hard disk fixing mechanism of claim 14, wherein:

the sliding block comprises a connecting portion;

one end of the connecting portion is coupled to a side of the second plate facing the first fixing rod;

a distal end of the connecting portion is bent away from the first fixing rod;

one end of the elastic piece is coupled to the connecting portion.

16. The hard disk fixing mechanism of claim 15, further comprising a second fixing rod, wherein:

the second fixing rod is arranged on the first fixing plate and spaced apart from the first fixing rod;

the first plate is slidably sleeved over the first fixing rod and the second fixing rod.

* * * * *